(12) United States Patent
Kim et al.

(10) Patent No.: US 8,253,134 B2
(45) Date of Patent: Aug. 28, 2012

(54) OXIDE THIN FILM TRANSISTOR

(75) Inventors: Sun-il Kim, Yongin-si (KR); Jae-cheol Lee, Suwon-si (KR); I-hun Song, Seongnam-si (KR); Young-soo Park, Yongin-si (KR); Chang-jung Kim, Yongin-si (KR); Jae-chul Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 612 days.

(21) Appl. No.: 12/076,486

(22) Filed: Mar. 19, 2008

(65) Prior Publication Data
US 2009/0057663 A1 Mar. 5, 2009

(30) Foreign Application Priority Data
Aug. 29, 2007 (KR) .................. 10-2007-0087307

(51) Int. Cl.
*H01L 29/12* (2006.01)
*H01L 29/04* (2006.01)
*H01L 31/036* (2006.01)

(52) U.S. Cl. ....... 257/43; 257/57; 257/59; 257/E29.101; 257/E29.08

(58) Field of Classification Search ............... 257/43, 257/57, 59, E29.08, E29.101
See application file for complete search history.

(56) References Cited

U.S. PATENT DOCUMENTS

| | | | | |
|---|---|---|---|---|
| 7,262,463 B2* | 8/2007 | Hoffman | ................ | 257/347 |
| 7,309,895 B2* | 12/2007 | Hoffman et al. | ............ | 257/347 |
| 2004/0211458 A1* | 10/2004 | Gui et al. | ................ | 136/244 |
| 2005/0199880 A1* | 9/2005 | Hoffman et al. | ............ | 257/72 |
| 2005/0199959 A1* | 9/2005 | Chiang et al. | ............... | 257/368 |
| 2005/0275038 A1* | 12/2005 | Shih et al. | ................ | 257/382 |
| 2006/0086936 A1 | 4/2006 | Hoffman et al. | | |
| 2006/0177947 A1* | 8/2006 | Yoshida et al. | ............ | 438/3 |
| 2007/0072439 A1* | 3/2007 | Akimoto et al. | ............ | 438/795 |
| 2009/0224238 A1* | 9/2009 | Kim et al. | ................ | 257/43 |

FOREIGN PATENT DOCUMENTS
KR 2006-0103241 9/2006

* cited by examiner

*Primary Examiner* — Shouxiang Hu
(74) *Attorney, Agent, or Firm* — Harness, Dickey & Pierce, PLC

(57) ABSTRACT

An oxide thin film transistor and a method of manufacturing the oxide TFT are provided. The oxide thin film transistor (TFT) including: a gate; a channel formed to correspond to the gate, and a capping layer having a higher work function than the channel; a gate insulator disposed between the gate and the channel; and a source and drain respectively contacting either side of the capping layer and the channel and partially on a top surface of the capping layer.

6 Claims, 11 Drawing Sheets

OXIDE THIN FILM TRANSISTOR

CROSS-REFERENCE TO RELATED PATENT APPLICATION

This application claims priority from Korean Patent Application No. 10-2007-0087307, filed on Aug. 29, 2007, in the Korean Intellectual Property Office, the disclosure of which is incorporated herein in its entirety by reference.

BACKGROUND OF THE INVENTION

1. Field of the Invention

The present invention relates to an oxide thin film transistor. More particularly, the present invention relates to an oxide thin film transistor in which a capping layer is formed on a channel region, thereby enhancing electrical characteristics, and a method of manufacturing the oxide thin film transistor.

2. Description of the Related Art

Thin Film Transistors (TFTs) are currently utilized in various application fields. In particular, TFTs have been used as switching and driving devices in the display field and as selective switches of cross-point type memory devices.

While Liquid Crystal Displays (LCDs) have been mainly used as display panels for TVs, much research into Organic Light-Emitting Displays (OLEDs) has also been conducted for their application to TVs. Development of TV display technology is being promoted to satisfy market demands. The market demands include larger-sized TVs or Digital Information Displays (DIDs), lower costs, higher-quality images (better dynamic image presentation, definition, luminosity, contrast ratio, color reproduction), etc. In order to satisfy these demands, in addition to the fabrication of large-sized substrates (e.g., glasses), high-performance TFTs that can be utilized as switching and driving devices for displays are required.

Amorphous silicon TFTs (a-Si TFTs) are used as driving and switching devices for displays. Such a-Si TFTs are devices that can be uniformly formed on large-sized substrates at low costs, and thus, are currently the most widely used devices. However, with a recent trend towards large-size and high image quality displays, TFTs are required to have a high performance. However, it is thought that conventional a-Si TFTs with a mobility of 0.5 $cm^2$/Vs have reached a limit in their application. In this regard, high-performance TFTs with a higher mobility than conventional a-Si TFTs and their fabrication technologies are needed.

Polycrystalline silicon TFTs (poly-Si TFTs), having outstandingly better performance than conventional a-Si TFTs, have a high mobility of several tens to several hundreds of $cm^2$/Vs, and thus, the poly-Si TFTs can be applied in displays with high image quality, which is a fact that cannot be realized by conventional a-Si TFTs. Moreover, the characteristics of poly-Si TFTs hardly degrade in comparison to conventional a-Si TFTs. However, in order to manufacture poly-Si TFTs, complicated processes are required as compared to conventional a-Si TFTs, thus incurring additional costs. That is, poly-Si TFTs are suitable for manufacturing displays with high image quality, and thus, can be applied to products such as OLEDs, however, poly-Si TFTs are less cost-effective than conventional a-Si TFTs, and thus, are restrictively applied. In addition, with respect to poly-Si TFTs, due to technological problems such as the limitation in the manufacture equipment or lack of uniformity, the formation of poly-Si TFTs on large-sized substrates has not been currently realized, which makes it difficult to apply poly-Si TFTs to large-sized TV products.

Thus, a new TFT technology for TFTs having both the advantages of a-Si TFTs and poly-Si TFTs is required, and research on this is being actively carried out. Thus, oxide semiconductor devices are a representative example of this.

Specifically, ZnO-based TFTs have been recently highlighted as such oxide semiconductor devices. ZnO, InZnO, IZO, GaInZnO, GIZO, etc. are currently known as ZnO-based materials. ZnO-based semiconductor devices can be manufactured from an amorphous ZnO-based semiconductor using a low-temperature process, thus enabling easy manufacture of ZnO-based semiconductor devices on large-sized substrates. A ZnO-based semiconductor is a material with high mobility and has excellent electrical properties like polycrystalline silicon. Currently, research is being carried out in order to apply an oxide semiconductor material layer with high mobility, i.e., a ZnO-based material layer, to a channel region of a TFT.

SUMMARY OF THE INVENTION

The present invention provides an oxide thin film transistor having a channel including a capping layer and excellent electrical characteristics.

The present invention also provides a method of manufacturing an oxide thin film transistor having a channel including a capping layer.

According to an aspect of the present invention, there is provided an oxide thin film transistor (TFT) comprising: a gate; a channel formed to correspond to the gate, and a capping layer having a higher work function than the channel; a gate insulator disposed between the gate and the channel; and a source and drain respectively contacting either side of the capping layer and the channel and partially on a top surface of the capping layer.

The channel may be formed of a material of In—Zn oxide doped with Ni.

The channel may be formed of a material of Ni—In—Zn oxide doped with a first, a second, or a third group transition element.

The first group transition element may be Cu, Ag, or Au, the second group transition element may be Pd, Pt, or Ds, and the third group transition element may be Co, Ir, or Mt.

The capping layer may be Ga—In—Zn oxide.

The capping layer may be Ga—In—Zn oxide doped with the first or the second group element.

A method of manufacturing an oxide TFT comprising: forming a gate on a substrate, and forming a gate insulating layer on the substrate by covering the gate; forming a channel, and a capping layer having a higher work function than the channel on the gate insulating layer such that the channel corresponds to the capping layer; and forming a source and a drain on either side of the capping layer and the channel and partially on a top surface of the capping layer.

The channel may be formed of a material of In—Zn oxide doped with Ni.

The channel may be formed of a material of Ni—In—Zn oxide doped with a first, a second, or a third group transition element.

The capping layer may be Ga—In—Zn oxide.

The capping layer may be Ga—In—Zn oxide doped with the first or the second group element.

According to another aspect of the present invention, there is provided a method of manufacturing an oxide TFT comprising: forming a channel, and a capping layer having a higher work function than the channel on a surface portion of a substrate; forming a source and a drain on either side of the capping layer and the channel so as to expose the capping layer; and forming a gate insulating layer on the capping layer, the source, and the drain, and forming a gate, corresponding to the capping layer, on the gate insulating layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
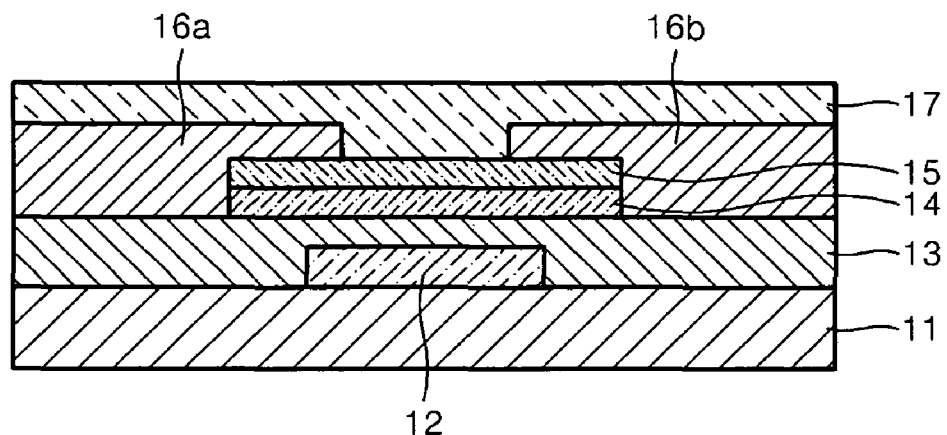
FIG. 1A is a cross-sectional view illustrating a bottom gate type oxide Thin Film Transistor (TFT) according to an embodiment of the present invention.

An oxide Thin Film Transistor (TFT) and a method of manufacturing the same, according to the present invention, will now be described more fully with reference to the accompanying drawings, in which exemplary embodiments of the invention are shown. For reference, the thicknesses and widths of layers shown in the drawings are exaggerated for the purpose of understanding.

Figure 1B:
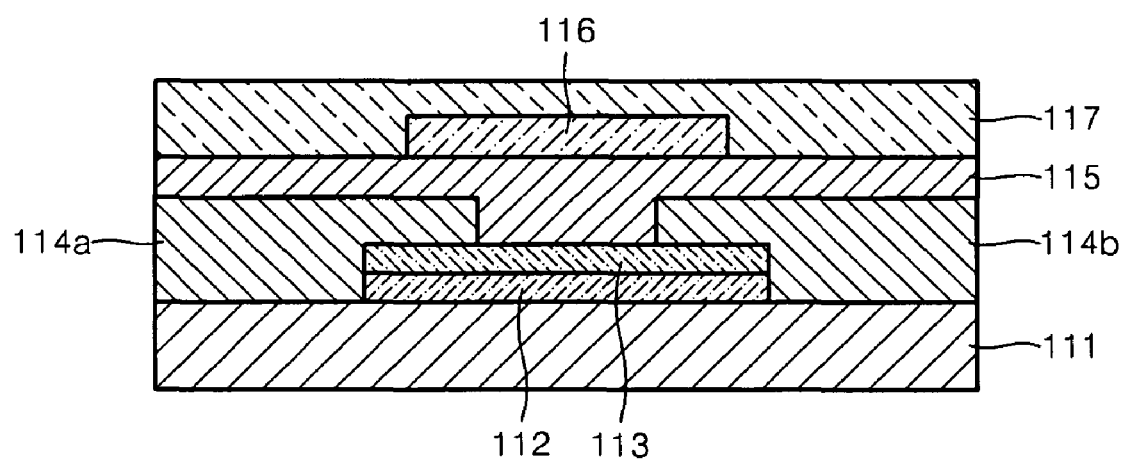
FIG. 1B is a cross-sectional view illustrating a top gate type oxide TFT according to an embodiment of the present invention.

FIG. 1A is a cross-sectional view illustrating a bottom gate type oxide TFT according to an embodiment of the present invention. FIG. 1B is a cross-sectional view illustrating a top gate type oxide TFT according to an embodiment of the present invention.

A bottom gate type oxide TFT according to an embodiment of the present invention comprises a gate, a channel formed corresponding to the gate and a capping layer having a higher work function than the channel, a gate insulator disposed between the gate and the channel, and a source and a drain disposed on either side of the capping layer so as to contact with the capping layer. The bottom gate and the top gate type oxide TFT will now be described with reference to FIGS. 1A and 1B.

Referring to FIG. 1A, the bottom gate type oxide TFT includes a gate 12 disposed on a surface portion of a substrate 11, and a gate insulating layer 13 disposed on the substrate 11 by covering the gate 12. When the substrate 11 is a silicon substrate, an oxide layer can be formed on a surface of the substrate 11. A channel 14 and a capping layer 15 are formed on a surface portion of the gate insulating layer 13, wherein the channel 14 is an active region and corresponds to the capping layer 15. A source 16a and a drain 16b are disposed on the gate insulating layer 13, on either side of the channel 15 and capping layer 13 and partially on the top surface of the capping layer 15. A passivation layer 17 is disposed on the capping layer 15, such that the passivation layer 17 is between the source 16a and the drain 16b, and on the source 16a and the drain 16b.

Referring to FIG. 1B, the top gate type oxide TFT includes a channel 112 and a capping layer 113 that are disposed on a surface portion of a substrate 111, wherein the channel 112 is an active region and corresponds to the capping layer 13. A source 114a and a drain 114b are disposed on either side of the capping layer 113 and the channel 114 and partially on a top surface of the capping layer 113. A gate insulating layer 115 is disposed on the capping layer 113, such that the gate insulation is between the source 114a and the drain 114b, and on the source 114a and the drain 114b. A gate 116 is partially formed on the gate insulating layer 115, such that the gate corresponds to the capping layer 113. A passivation layer 117 is disposed on the gate insulating layer 115 by covering the gate 116.

A top gate type oxide TFT according to an embodiment of the present invention includes a channel as an active region and a capping layer formed of one or more layers on a surface portion of the channel. The capping layer is formed of a material having a higher work function than the channel.

A material forming each layer of the top gate type and the bottom gate type oxide TFT according to the current embodiments of the present invention will now be described. The substrates 11 and 111 may be a substrate commonly used in semiconductor devices. For example, the substrate 11 may be formed of Si, glass, or an organic material. The gates 12 and 116 may be formed of a conductive material, e.g., a metal or metal oxide. The gate insulating layers 13 and 115 may be formed of an insulating material commonly used in semiconductor devices, e.g., silicon oxide or nitride. For example, the gate insulating layers 13 and 115 may be formed of $SiO_2$, a high-k material having a higher dielectric constant than $SiO_2$, e.g., $HfO_2$, $Al_2O_3$, $Si_3N_4$, or a mixture thereof. The sources 16a and 114a and the drains 16b and 114b may be formed of a conductive material, e.g., a metal such as Pt, Ru, Au, Ag, Mo, Al, W, or Cu, or a conductive metal oxide such as IZO (InZnO) or AZO(AlZnO).

The capping layers 15 and 113 are formed of a material having a higher work function than the channels 14 and 112. In more detail, the material of the channels 14 and 112 may be NIZO that is In—Zn oxide (IZO) doped with Ni. The material of the channels 14 and 112 may be IZO doped with a first, a second, or a third group transition element. The first group transition element may be Cu, Ag, or Au. The second group transition element may be Pd, Pt, or Ds. The third group transition element may be Co, Ir, or Mt. The capping layers 15 and 113 are formed of a material having a higher work function than the channels 14 and 112. The material of the capping layers 15 and 113 may be GIZO or GIZO doped with the first or the second group element such as Cu or Ni.

A method of manufacturing a bottom and a top gate type oxide TFT will now be described in detail with reference to the drawings of FIGS. 2A through 2H and FIG. 3A through 3G.

Figure 2A:
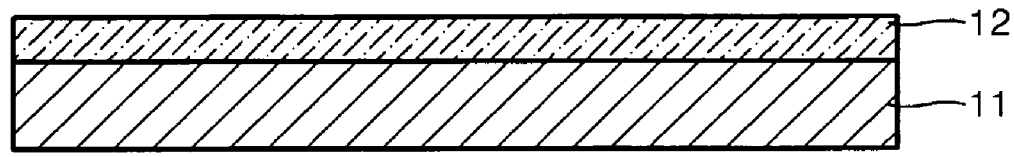
FIGS. 2A through 2H are diagrams illustrating a method of manufacturing the bottom gate type oxide TFT of FIG. 1A, according to an embodiment of the present invention.
Figure 2B:
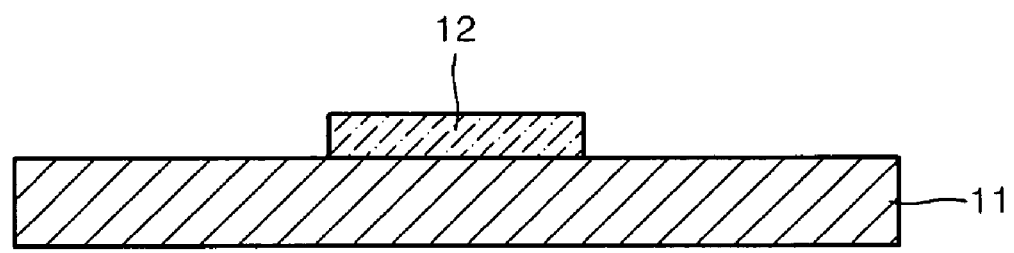

FIGS. 2A through 2H are diagrams illustrating the method of manufacturing the bottom gate type oxide TFT shown in FIG. 1A, according to an embodiment of the present invention. Referring to FIG. 2A, the substrate 11 is prepared. The substrate 11 may be formed of Si, glass, or an organic material. When using a Si substrate for the substrate 11, an insulating layer can be formed on a surface of the Si substrate by a thermal oxidation process. A conductive material, such as a metal or conductive metal oxide, is coated on the substrate 11 in order to form a gate electrode on the substrate 11. Referring to FIG. 2B, the conductive material of the gate electrode is then patterned to form the gate 12.

Figure 2C:
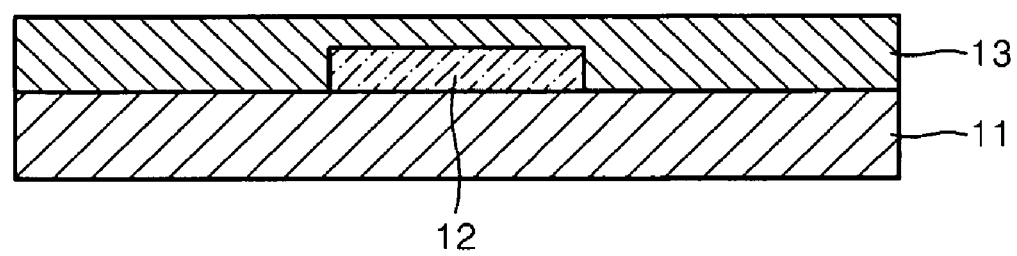

Referring to FIG. 2C, an insulating material is coated on the substrate 11 by covering the gate 12 and patterned to form the gate insulating layer 13.

Figure 2D:
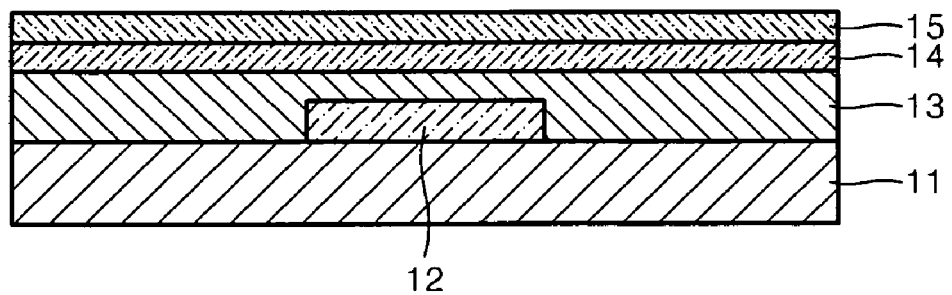
Figure 2E:
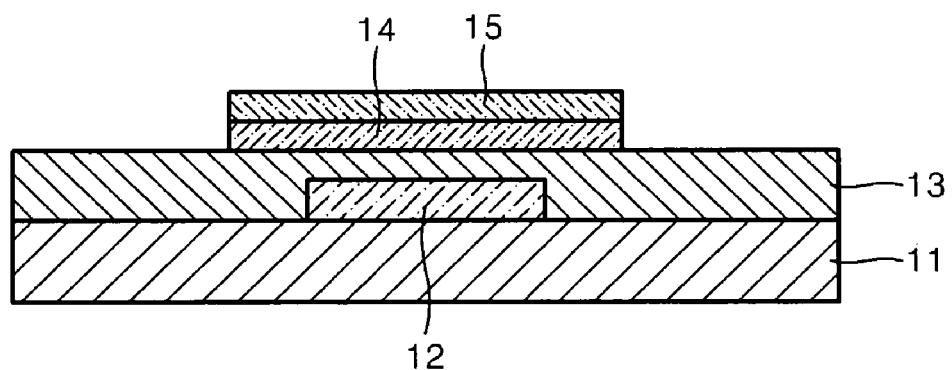

Referring to FIG. 2D, a channel material and a capping layer material are coated on the gate insulating layer 13 corresponding to the gate insulating layer 13 using a process such as PVD, CVD, or ALD. Referring to FIG. 2E, the channel material and the capping layer material are then patterned to form the channel 14 and the capping layer 15 corresponding to the channel 14.

Figure 2F:
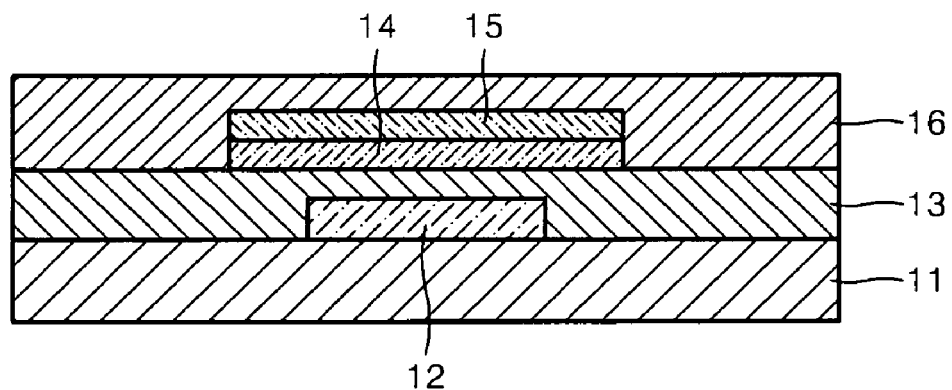
Figure 2G:
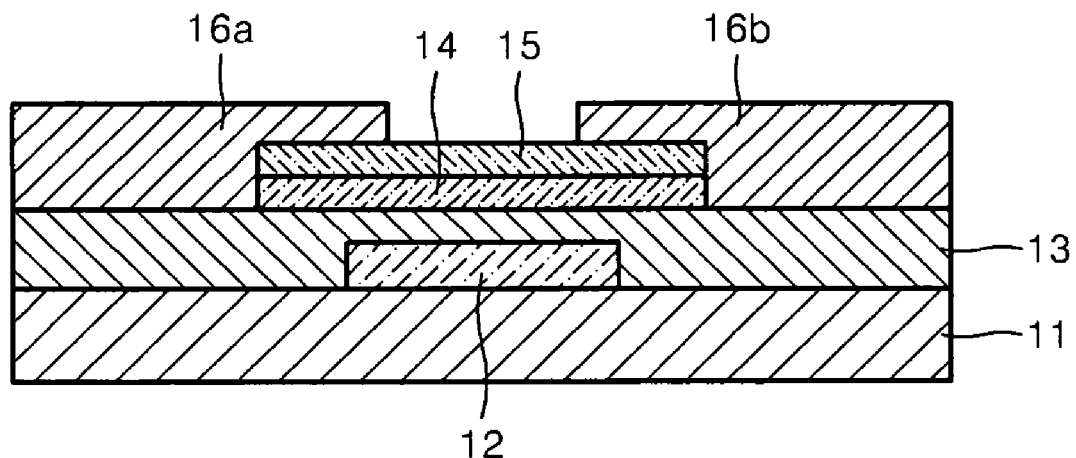

Referring to FIG. 2F, a metal or a conductive metal oxide is coated on the gate insulating layer 13 by covering the capping layer 15 and the channel 14 to form a conductive material layer 16. Referring to FIG. 2G, the conductive material layer 16 is etched so that the source 16a and the drain 16b are formed and the capping layer 15 is exposed.

Figure 2H:
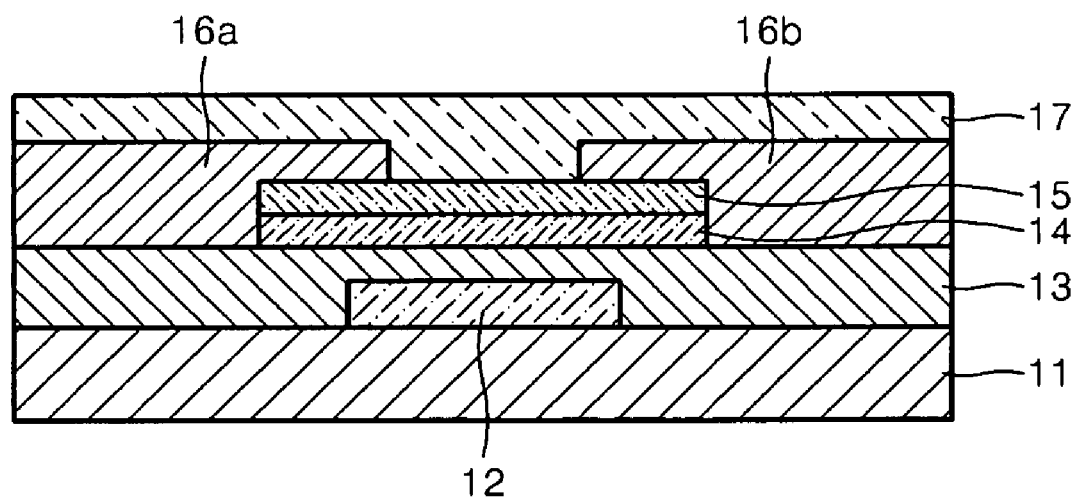

Finally, referring to FIG. 2H, an insulating material is coated on the capping layer 15 to form the passivation layer 17.

Figure 3A:
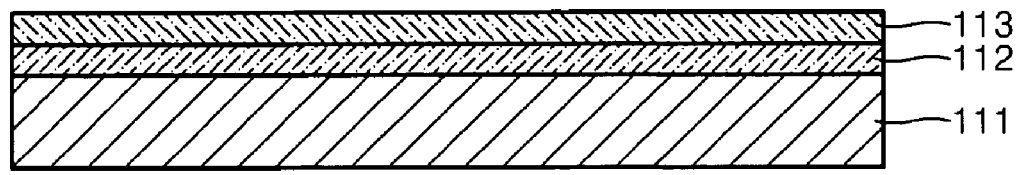
FIGS. 3A through 3G are diagrams illustrating a method of manufacturing the top gate type oxide TFT of FIG. 1B, according to an embodiment of the present invention.
Figure 3B:
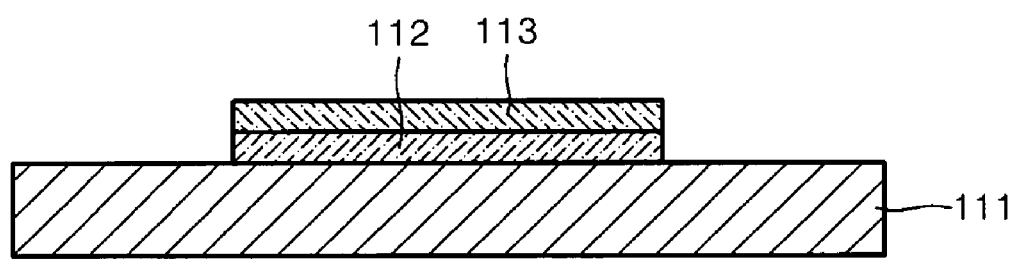

FIGS. 3A through 3G are diagrams illustrating the method of manufacturing the top gate type oxide TFT shown in FIG. 1B, according to an embodiment of the present invention. Referring to FIG. 3A, the substrate 111 is prepared. The substrate 111 may be formed of Si, glass, or an organic material. A channel material and a capping layer material are coated on the substrate 111 using a process such as PVD, CVD, or ALD. Referring to FIG. 3B, a patterning process is used to form the channel 112 and the capping layer 113.

Figure 3C:
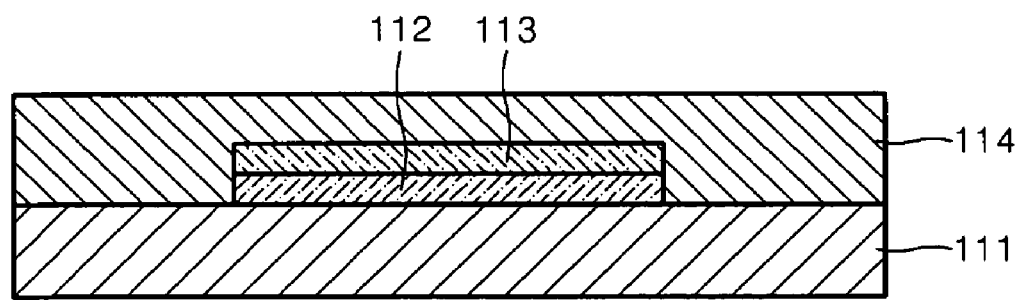
Figure 3D:
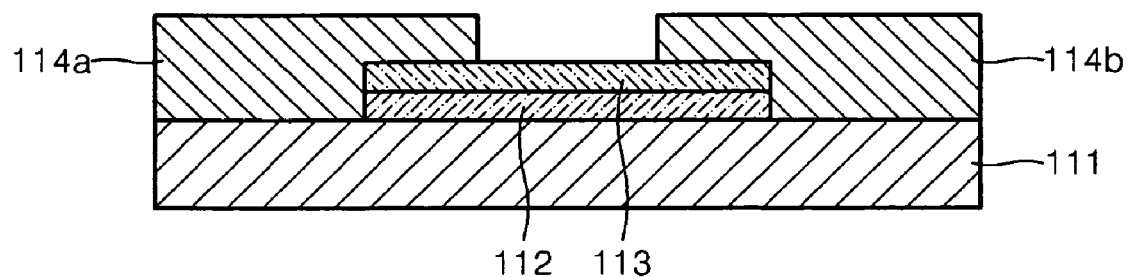

Referring to FIG. 3C, a metal or a conductive metal oxide is coated on the substrate 111 by covering the capping layer 113 and the channel 112 to form a conductive material layer 114. Referring to FIG. 3D, the conductive material layer 114 is etched so that the source 114a and the drain 114b are formed and the capping layer 113 is exposed.

Figure 3E:
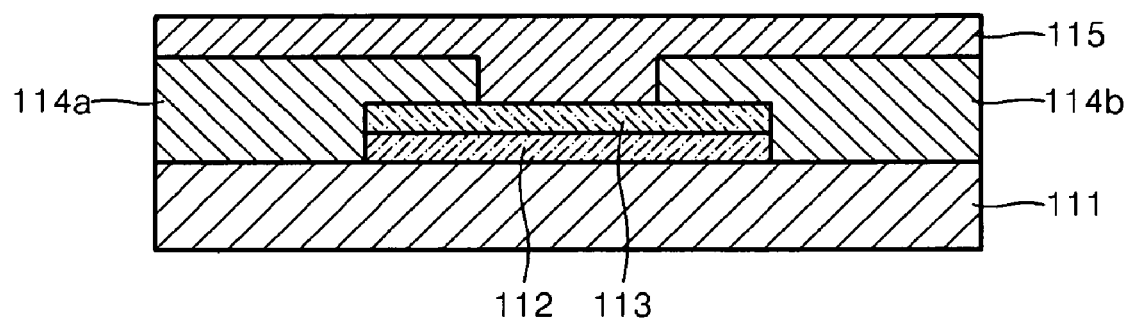
Figure 3F:
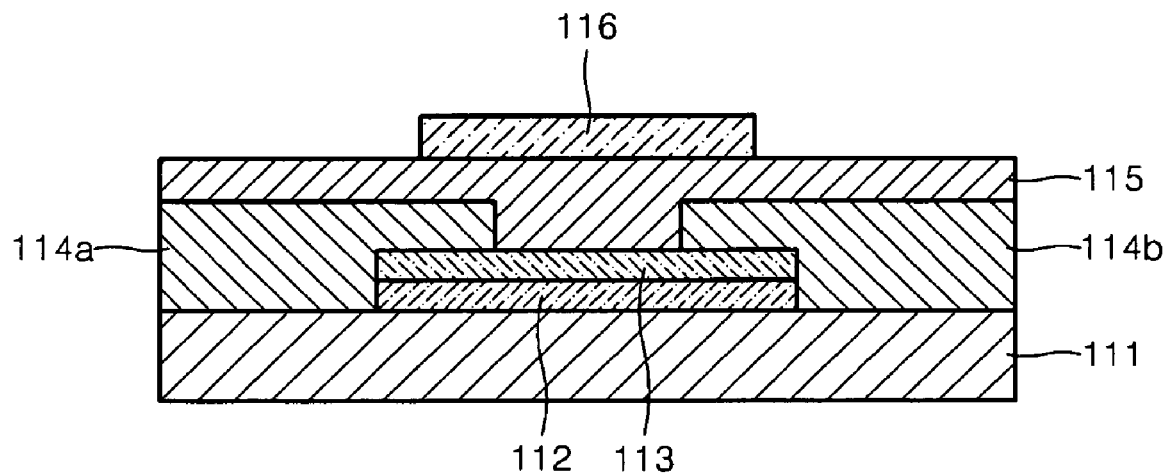

Referring to FIG. 3E, an insulating material is coated on the capping layer 113, the source 114a, and the drain 114b to form the gate insulating layer 115. Referring to FIG. 3F, a metal or a conductive material, such as a conductive metal oxide, is coated on the gate insulating layer 115, the conductive material is then patterned to form the gate 116.

Figure 3G:
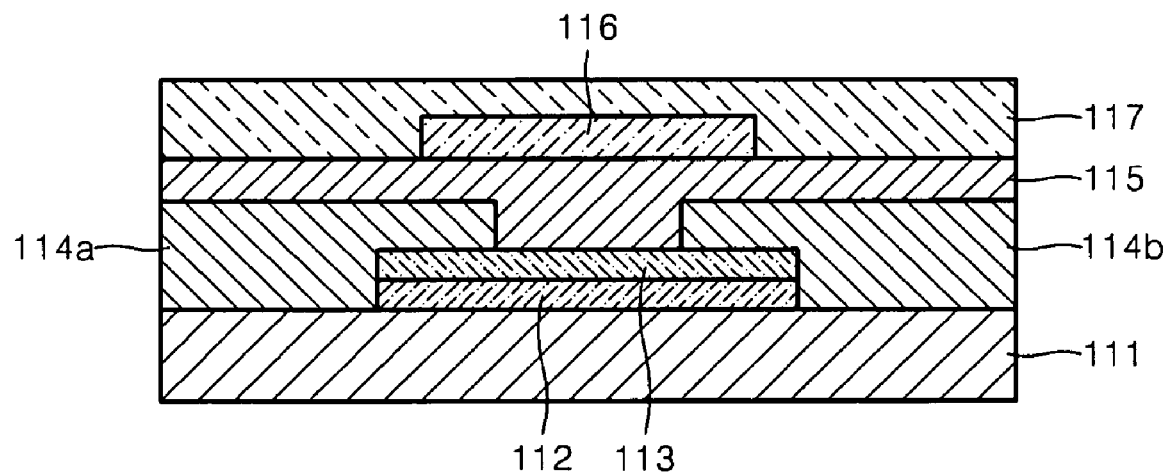

Referring to FIG. 3G, an insulating material is coated on the gate insulating layer 115 by covering the gate 116 to form the passivation layer 17.

After the top gate type oxide TFT of the present embodiment is formed, the resultant structure may be thermally treated at 400° C. or less, e.g., at 300° C., using a furnace, Rapid Thermal Annealing (RTA), laser, or a hot plate.

The electrical characteristics of the bottom and top gate type oxide TFT of the present embodiments will now be described with reference to the drawings.

Figure 4:
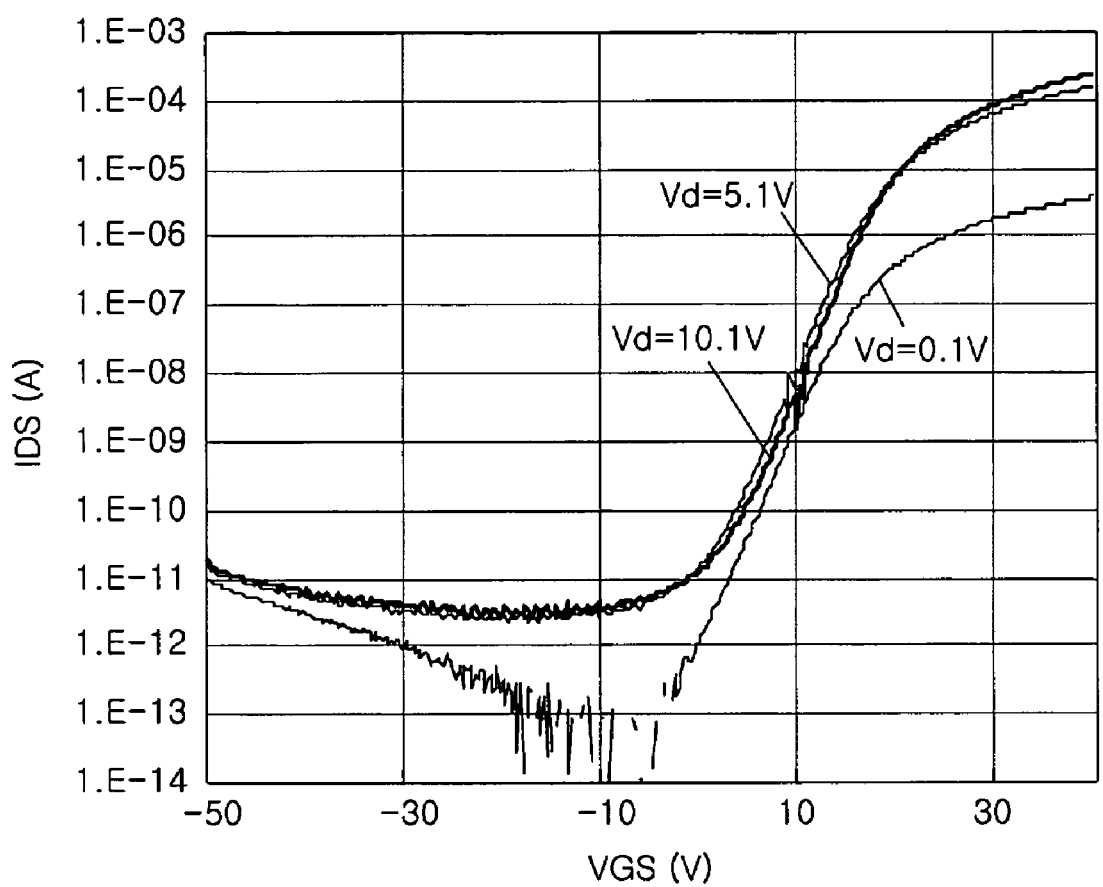
FIG. 4 is a graph showing the electrical characteristics of an oxide TFT according to an embodiment of the present invention.
Figure 5:
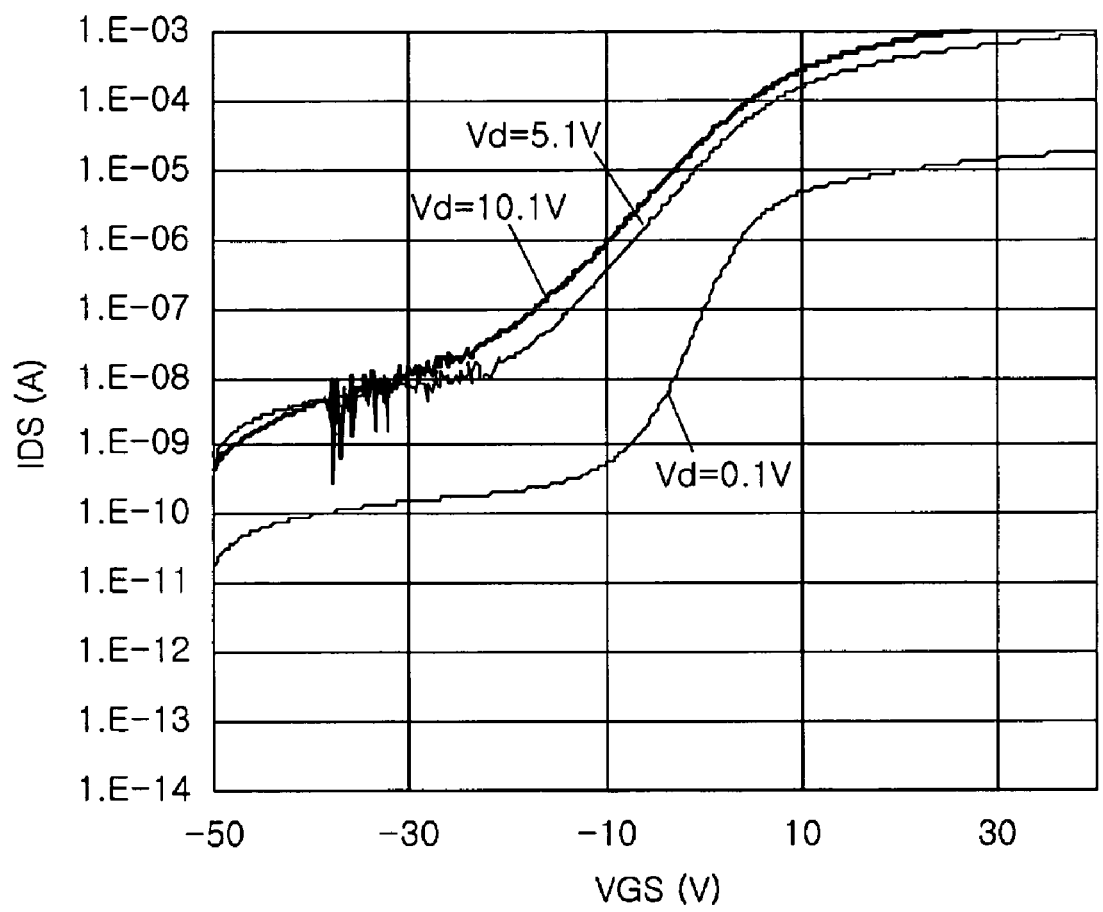
FIG. 5 is a graph showing the electrical characteristics of a conventional oxide TFT.

FIG. 4 is a graph showing the electrical characteristics of an oxide TFT according to an embodiment of the present invention. FIG. 5 is a graph showing the electrical characteristics of a conventional oxide TFT.

Referring to FIG. 4, the graph shows a change in gate voltage VGS according to drain current IDS of the oxide TFT including an NIZO channel layer as an active region and a GIZO capping layer doped with Cu for a source-drain voltage Vd of 0.1V, 5.1V, 10.1V. When the source-drain voltage Vd is 10.1V, an ON current is about $10^{-4}$ A, an OFF current is less than $10^{-12}$ A, and an ON/OFF current ratio is $10^8$ or more. A sub-threshold swing (SS) is about 0.83 V/dec.

Referring to FIG. 5, the graph shows a change in gate voltage VGS according to drain current IDS of the conventional oxide TFT including an NIZO channel layer as an active region for a source-drain voltage Vd of 0.1V, 5.1V, 10.1V. When the source-drain voltage Vd is 10.1V, an ON/OFF current ratio is about $10^5$, and a sub-threshold swing (S,S) is about 4.90 V/dec.

Figure 6:
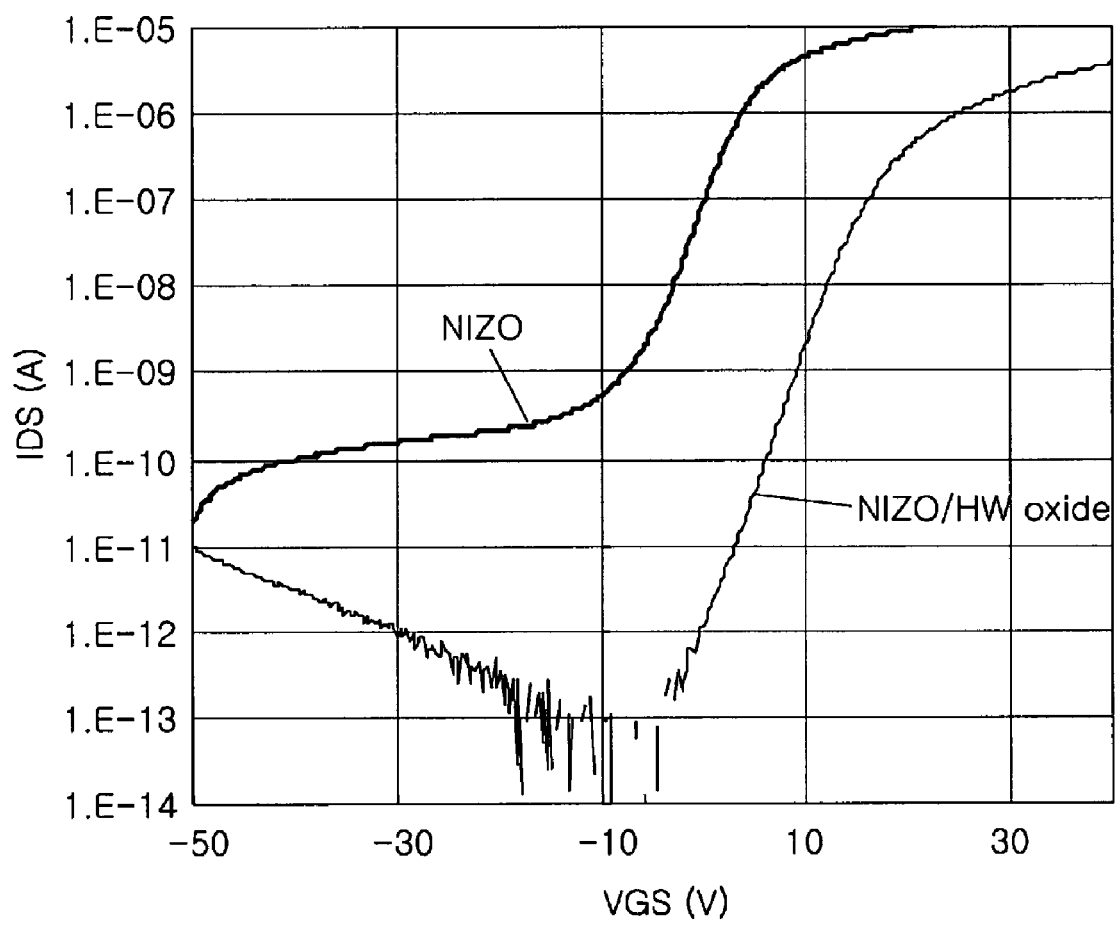
FIG. 6 is a graph showing the electrical characteristics of an oxide TFT according to an embodiment of the present invention relative to a conventional oxide TFT.

FIG. 6 is a graph showing the electrical characteristics of an oxide TFT according to an embodiment of the present invention relative to a conventional oxide TFT. Referring to FIG. 6, the graph shows a change in gate voltage VGS according to drain current IDS for a source-drain voltage Vd of 0.1V, which results in the same plot for the oxide TFT of FIG. 5. A channel is formed in an active region and a capping layer having a higher work function than the channel is formed on a surface portion of the channel, so that an ON/OFF current ratio greatly increases and the SS characteristics are enhanced.

Figure 7:
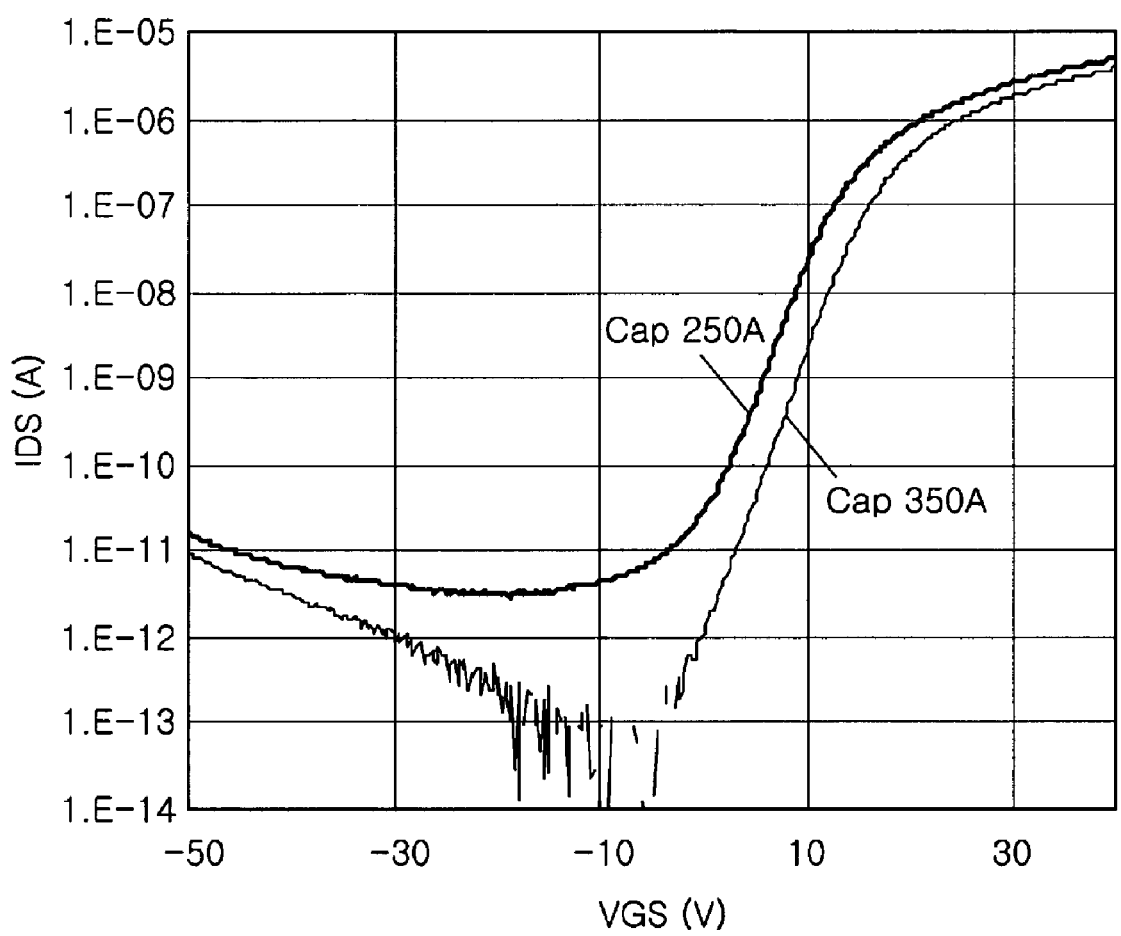
FIG. 7 is a graph showing the electrical characteristics of an oxide TFT according to an embodiment of the present invention with respect to the thickness of a capping layer, according to an embodiment of the present invention.

FIG. 7 is a graph showing the electrical characteristics of an oxide TFT according to an embodiment of the present invention with respect to the thickness of a capping layer, according to an embodiment of the present invention. Referring to FIG. 7, the graph shows the electrical characteristics of the oxide TFT including an NIZO channel layer as an active region and a GIZO capping layer doped with Cu by using a sample capping layer having thicknesses of 350 Å and 250 Å. As the thickness of the capping layer increases, off current is reduced and the S,S characteristics are enhanced. Meanwhile, an on current does not greatly vary according to the thickness of the capping layer.

The present invention provides the following advantages.

First, an oxide TFT has a multilayer structure in which a channel is formed as an active region and a capping layer, formed of a material having a higher work function than the channel, is formed, so that a new structure and a new material can be applied to the channel.

Second, an oxide TFT exhibits excellent "ON/OFF" current characteristics and the S.S characteristics owing to the use of a new material.

Based on the above-described embodiments, one of ordinary skill in the art can manufacture various electronic devices, such as displays and cross-point type memory devices, using an oxide TFT according to the technical spirit of the present invention.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. An oxide thin film transistor (TFT) comprising:
   a gate;
   a channel on the gate;
   a capping layer on the channel, the capping layer having a higher work function than the channel, the capping layer and the channel having substantially the same width;
   a gate insulator between the gate and the channel; and
   a source and drain each partially covering a top surface of the capping layer and each covering sides of the capping layer and sides of the channel, wherein the capping layer includes an oxide not included in the channel.

2. The oxide TFT of claim 1, wherein the channel is formed of a material of In—Zn oxide doped with Ni.

3. The oxide TFT of claim 1, wherein the channel is formed of a material of Ni—In—Zn oxide doped with a first, a second, or a third group transition element.

4. The oxide TFT of claim 3, wherein the first group transition element may be Cu, Ag, or Au, the second group transition element may be Pd, Pt, or Ds, and the third group transition element may be Co, Ir, or Mt.

5. The oxide TFT of claim 2, wherein the capping layer is Ga—In—Zn oxide.

6. The oxide TFT of claim 2, wherein the capping layer is Ga—In—Zn oxide doped with at least one of Cu, Ag, Au, Pd, Pt, and DS.

* * * * *